(12) United States Patent
Yang et al.

(10) Patent No.: US 6,430,051 B1
(45) Date of Patent: Aug. 6, 2002

(54) HEAT SINK CLIP WITH PIVOTALLY CONNECTED ARMS

(75) Inventors: Ming Hung Yang; Cheng-Chi Lee, both of Taipei (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/894,095

(22) Filed: Jun. 28, 2001

(30) Foreign Application Priority Data

May 8, 2001 (TW) ........................................ 090207486

(51) Int. Cl.[7] ................................................ H05K 7/20
(52) U.S. Cl. ........................... 361/704; 16/223; 16/371; 257/719
(58) Field of Search ............................. 165/80.3, 185; 174/16.3; 257/722, 718, 719, 726, 727; 361/687, 703, 704, 707–712, 717–719, 722; 248/316.7, 505, 510; 24/453, 457, 458, 625; 16/223, 366, 371, DIG. 3

(56) References Cited

U.S. PATENT DOCUMENTS

| | | | | |
|---|---|---|---|---|
| 4,486,919 A | * | 12/1984 | Schoenke | 16/366 |
| 5,561,887 A | * | 10/1996 | Neag et al. | 16/334 |
| 5,685,046 A | * | 11/1997 | Neag et al. | 16/366 |
| 5,946,187 A | * | 8/1999 | Cipolla | 361/687 |

* cited by examiner

Primary Examiner—Gerald Tolin
(74) Attorney, Agent, or Firm—WeiTe Chung

(57) ABSTRACT

A clip (10) for securing a heat sink (20) to a CPU (30) mounted on a CPU socket (40) includes first and second latching arms (50, 70) and a connecting portion (80). The first latching arm includes a horizontal first main body (52), and a first through hole (58) defined in the first main body. The second latching arm includes a horizontal second main body (72), and a second through hole (78) defined in the second main body. An end of the second main body directly confronts an end of the first main body. The connecting portion defines a pair of first and second pivot holes (86, 88), and is pivotally connected to each of the first and second latching arms. The connecting portion is rotated, and the second latching arm climbs up and along the first latching arm. The clip thereby firmly engages with catches of the CPU socket.

20 Claims, 3 Drawing Sheets

HEAT SINK CLIP WITH PIVOTALLY CONNECTED ARMS

BACKGROUND OF THE INVENTION

1. Field of the Invention

The present invention relates to a clip, and particularly to a clip which readily secures a heat sink to a heat-generating electronic device.

2. Description of Related Art

A computer central processing unit (CPU) is the most important part of many modern computers. Continuous development of CPUs has greatly enhanced their power and performance. Correspondingly, heat generated from CPUs is steadily increasing. This can adversely affect the operation and stability of modern computers. Measures must be taken to remove the heat from the CPU. Typically, a heat sink having great heat conductivity is mounted onto the CPU. A clip is often used to securely attach the heat sink to the CPU, thereby also achieving greater efficiency of heat dissipation.

A conventional clip is disclosed in Taiwan Patent Application No. 83217100. The clip includes a pressing portion located in a slot defined through fins of a heat sink, for pressing the heat sink onto an electronic device. A pair of arms, each with an aperture defined therein, depends from respective opposite ends of the pressing portion. The arms engage with corresponding catches of a retention module, thereby securing the heat sink on the electronic device.

Due to its inherent resilience, it is laborious to manually secure the clip to the retention module. Thus, an opening is often defined in each arm above the aperture, for insertion of a tool thereinto during assembly or disassembly. But this makes the procedures unduly complicated and inconvenient.

Thus, an adjustable clip which overcomes the above-mentioned problems is strongly desired.

SUMMARY OF THE INVENTION

Accordingly, an object of the present invention is to provide a clip which can readily secures a heat sink to an electronic device.

In order to achieve the above object, a clip of the present invention includes first and second latching arms and a connecting portion. The first latching arm includes a horizontal first main body, a bifurcate first pivot socket formed at an end of the first main body, and a first through hole defined in the first pivot socket. The second latching arm includes a horizontal second main body, a bifurcate second pivot socket formed at an end of the second main body, and a second through hole defined in the second pivot socket. An end of the second main body directly confronts an end of the first main body. The connecting portion defines first and second pivot holes respectively corresponding to the first and second through holes. The connecting portion is partly received in the first and second pivot sockets, and a pair of dowels pivotally connects the first and second latching arms to the connecting portion. In operation, the connecting portion is rotated. An end of the second latching arm climbs up and along an end of the first latching arm. The second latching arm partly overlaps the first latching arm, and the clip thereby firmly engages with catches of a socket.

Other objects, advantages and novel features of the present invention will become more apparent from the following detailed description when taken in conjunction with the accompanying drawings.

DETAILED DESCRIPTION OF THE INVENTION

Figure 1:
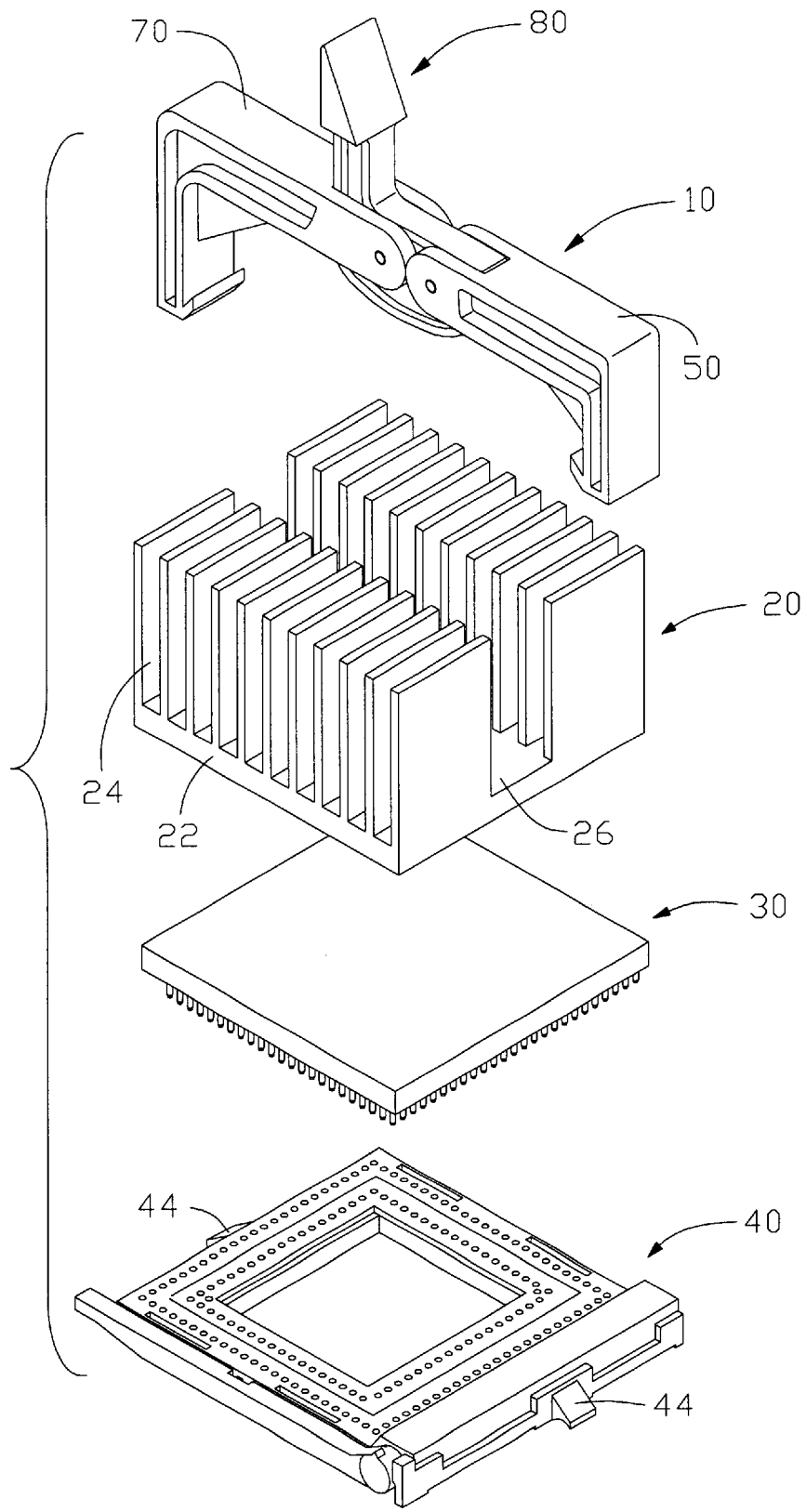
FIG. 1 is an exploded view of a clip in accordance with the present invention, for securing a heat sink to a central processing unit mounted on a socket.

Reference will now be made to the drawing figures to describe a preferred embodiment of the present invention in detail.

Figure 2:
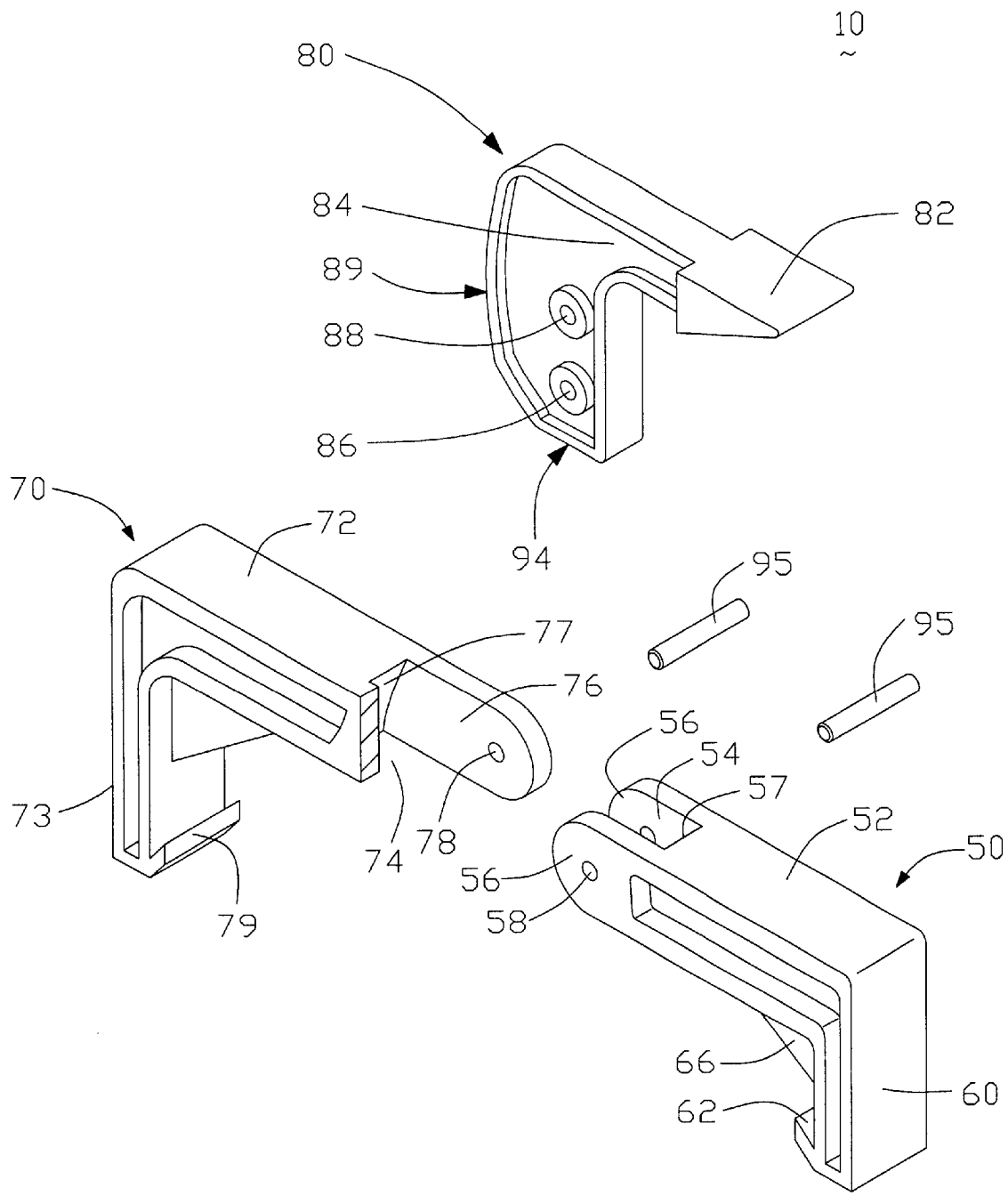
FIG. 2 is an exploded view of the clip of FIG. 1, with part of a second latching arm thereof cut away for clarity.

Referring to FIGS. 1 and 2, a clip 10 of the present invention is made of plastic material. The clip 10 comprises a first latching arm 50, a second latching arm 70 similar to the first latching arm 50, a connecting portion 80, and a pair of dowels 95. The connecting portion 80 and dowels 95 connect the first and second latching arms 50, 70 together. The clip 10 secures a heat sink 20 onto a central processing unit (CPU) 30 mounted on a CPU socket 40.

The heat sink 20 comprises a chassis 22, and a plurality of fins 24 extending vertically from the chassis 22. A receiving channel 26 is defined through a central portion of the fins 24, for receiving the clip 10 therein. The CPU socket 40 forms a pair of catches 44 at opposite sides thereof respectively, for engaging with the clip 10.

Referring particularly to FIG. 2, the first latching arm 50 of the clip 10 comprises a horizontal first main body 52, and a first latching portion 60 depending from an outer end of the first main body 52. The first latching portion 60 inwardly forms a first hook 62 at a bottom thereof, for engaging with one of the catches 44 of the CPU socket 40. An inner end of the first main body 52 is rounded, to allow rotational contact with the second latching arm 70. A first cutout 54 is defined in the inner end of the first main body 52, thereby forming a bifurcate first pivot socket 56. A first slope 57 is formed in the first pivot socket 56 at an inner extremity of the first cutout 54, for facilitating movement of the connecting portion 80. A first through hole 58 is defined in the first pivot socket 56, for insertion of one of the dowels 95 therein. A reinforcing rib 66 is formed between inner surfaces of the first main body 52 and the first latching portion 60.

The second latching arm 70 has a configuration similar to the first latching arm 50. The second latching arm 70 comprises a horizontal second main body 72, and a second latching portion 73 depending from an outer end of the second latching arm 70. In the preferred embodiment, the second latching portion 73 is longer than the first latching portion 60 of the first latching arm 50. The second latching portion 73 inwardly forms a second hook 79 at a bottom thereof, for engaging with the other catch 44 of the CPU socket 40. An inner end of the second main body 72 is rounded, to allow rotational contact with the first latching arm 50. A second cutout 74 is defined in the inner end of the second main body 72, thereby forming a bifurcate second pivot socket 76. A second slope 77 is formed in the second pivot socket 76 at an inner extremity of the second cutout 74, for facilitating movement of the connecting portion 80. A second through hole 78 is defined in the second pivot socket 74, for insertion of the other dowel 95 therein.

The connecting portion 80 comprises a pressing section 84, and a horizontal operating section 82. The operating section 82 is integrally formed with the pressing section 82, for facilitating operation of the connecting portion 80. The pressing section 84 is substantially cam-shaped. Vertically spaced first and second pivot holes 86, 88 are respectively defined in the vicinity of an inner edge of the pressing section 84. The first pivot hole 86 is below the second pivot hole 88, and corresponds to the first through hole 58 of the first latching arm 50. The second pivot hole 88 corresponds to the second through hole 78 of the second latching arm 70. First and second pressing surfaces 89, 94 are formed on an outer edge of the pressing section 84. The first pressing surface 89 is closer to the second pivot hole 88 than is the second pressing surface 94.

Referring to FIGS. 1 and 2, in assembly of the clip 10, the pressing section 84 of the connecting portion 80 is sandwiched between the first pivot socket 56 of the first latching arm 50 and the socket 76 of the second latching arm 70. The first and second pivot sockets 56, 76 directly confront and abut against each other. The first pivot hole 86 of the connecting portion 80 is aligned with the first through hole 58 of the first latching arm 50. The second pivot hole 88 of the connecting portion 80 is aligned with the second through hole 78 of the second latching arm 70. One dowel 95 is inserted into the aligned first through hole 58 and first pivot hole 86, thereby defining a first pivot point. The other dowel 95 is inserted into the aligned second through hole 78 and second pivot hole 88, thereby defining a second pivot point. Thus the operating portion 80 is pivotally connected to each of the first and second latching arms 50, 70. At this stage the operating section 82 is perpendicular to the first and second latching arms 50, 70, and the first and second main bodies 52, 72 are collinear (See FIG. 1).

Figure 3:
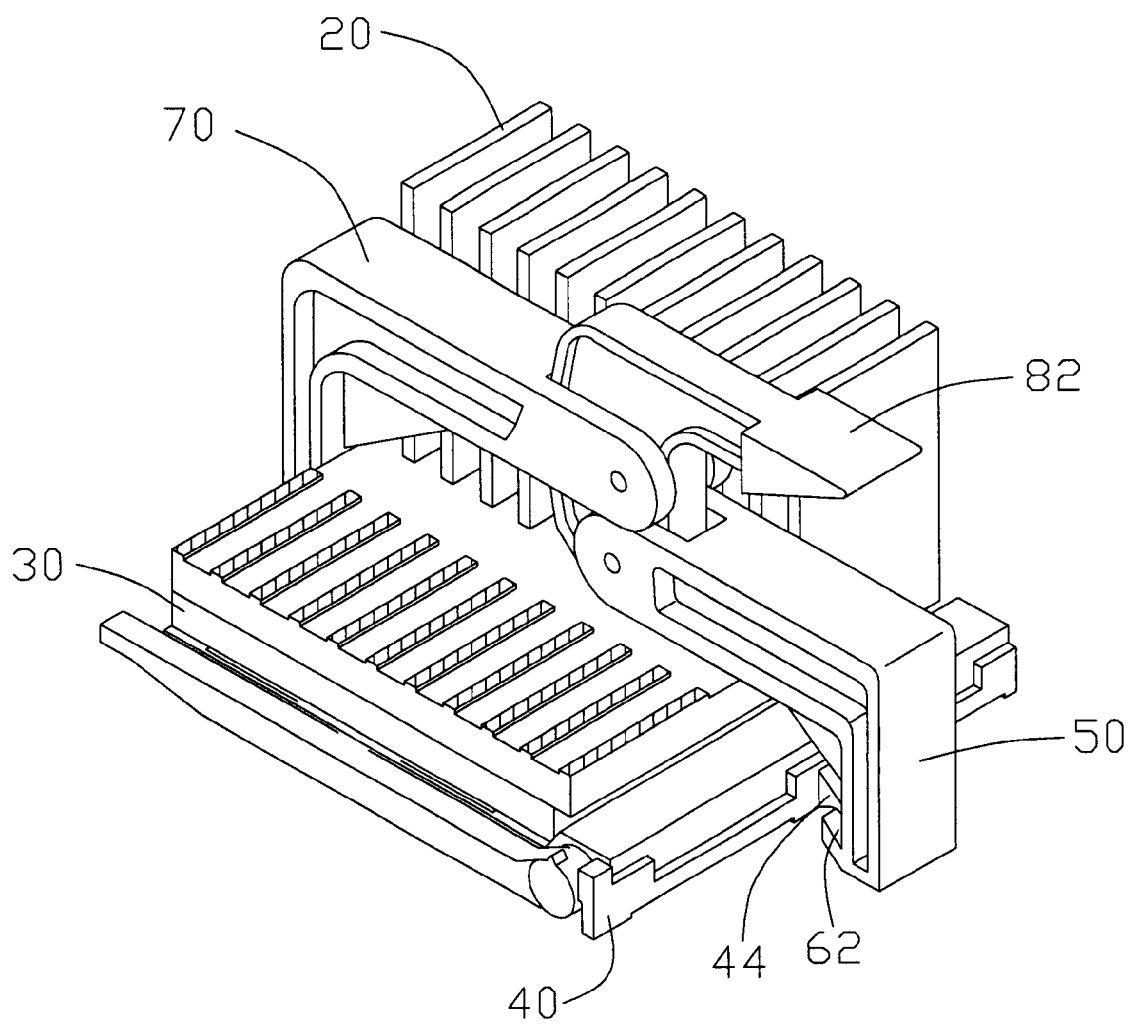
FIG. 3 is an assembled view of FIG. 1, with part of the heat sink cut away for clarity.

Referring to FIGS. 1 to 3, in use of the clip 10, the CPU 30 is mounted on the CPU socket 40. The heat sink 20 is placed on a top of the CPU 30. The clip 10 is received in the receiving channel 26 of the heat sink 20. The first pressing surface 89 of the connecting portion 80 is in contact with the chassis 22 of the heat sink 20. The hooks 62, 79 of the first and second latching arms 50, 70 are loosely engaged with the catches 44 of the CPU socket 40. The operating section 82 is then rotated toward the first latching arm 50, thus causing portions of the pressing section 84 to progressively slide on the chassis 22 of the heat sink 20. An outer end of the second pivot socket 76 simultaneously climbs up and along an outer surface of the first pivot socket 56. The first and second latching arms 50, 70 are thus both moved inwardly so that they begin to overlap each other. The operating section 82 is continued to be rotated until it is parallel to the first main body 52, at which point the second pressing surface 94 of the connecting portion 80 abuts against the chassis 22. As a result, the second latching arm 70 is raised to partly overlap an inner end of the first latching arm 50 at the first pivot socket 56. Consequently, the hooks 62, 79 of the clip 10 are firmly engaged with the catches 44 of the CPU socket 40. The heat sink 20 is thereby easily and firmly secured to the CPU 30 by the clip 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A clip for engaging with a heat sink and a socket supporting a CPU thereon, the clip comprising:
   a first latching arm comprising a horizontal first main body, a first through hole being defined in an end of the first main body;
   a second latching arm comprising a horizontal second main body, a second through hole being defined in an end of the second main body; and
   a connecting portion pivotally engaged with the first and second latching arms to join the first and second latching arms together the connecting portion defining first and second pivot holes therein; wherein a first pivot is inserted into the first through hole and first pivot hole, a second pivot is inserted into the second through hole and the second pivot hole, so that the connecting portion is rotatable about the first pivot hole, motivating the second latching arm to move about the second pivot hole.

2. The clip as described in claim 1, wherein the first latching arm further comprises a first latching portion depending from an opposite end of the first main body, and wherein the second latching arm further comprises a second latching portion depending from an opposite end of the second main body.

3. The clip as described in claim 2, wherein the second latching portion is longer than the first latching portion.

4. The clip as described in claim 1, wherein the ends of the first and second latching arms are rounded, to allow rotational contact therebetween.

5. The clip as described in claim 1, wherein a first cutout is defined in the end of the first main body, thereby forming a bifurcate first pivot socket.

6. The clip as described in claim 5, wherein the first through hole is defined in the first pivot socket.

7. The clip as described in claim 6, wherein a first slope is formed in the first pivot socket at an inner extremity of the first cutout.

8. The clip as described in claim 7, wherein a second cutout is defined in the end of the second main body, thereby forming a bifurcate second pivot socket.

9. The clip as described in claim 8, wherein the second through hole is defined in the second pivot socket.

10. The clip as described in claim 9, wherein a second slope is formed in the second pivot socket at an inner extremity of the second cutout.

11. A clip for securing a heat sink, comprising:
    a first latching arm comprising a first main body, a bifurcate first pivot socket being formed at an end of the first main body, a first through hole being defined in the first pivot socket;
    a second latching arm comprising a second main body, a bifurcate second pivot socket being formed at an end of the second main body and confronting the first pivot socket of the first latching arm, a second through hole being defined in the second pivot socket; and
    a connecting portion comprising a pressing section, the pressing section being partly received in the first and second pivot sockets and thereby connecting the first and second pivot sockets together, the pressing section defining first and second pivot holes therein respectively aligned and coaxial with the first and second through holes, the connecting portion being rotatable about the first pivot hole, motivating the second latching arm to move about the second pivot hole.

12. The clip as described in claim 11, wherein the first latching arm further comprises a first latching portion depending from an opposite end of the first main body, and wherein the second latching arm further comprises a second latching portion depending from an opposite end of the second main body.

13. The clip as described in claim 12, wherein the second latching portion is longer than the first latching portion.

14. The clip as described in claim 11, wherein the pressing section forms first and second pressing surfaces on an outer edge thereof, and wherein the first pressing surface is closer to the second pivot hole of the pressing section than is the second pressing surface.

15. A clip for fastening a heat sink to an electronic device mounted on a socket, comprising:
- a first latching arm comprising a horizontal first main body and a first latching portion depending from the first main body;
- a second latching arm comprising a horizontal second main body and a second latching portion depending from the second main body; and
- a connecting portion having two separated pivots respectively pivotally engaging with first and second main bodies, said connecting portion being pivotable about the first latching arm, motivating the second latching arm to move thereabout.

16. The clip in accordance with claim 15, wherein a free end of the second main body distant from the second latching portion overlaps a free end of the first main body distant from the first latching portion.

17. The clip in accordance with claim 16, wherein the second main body of the second latching arm defines a slope, the connecting arm urging the slope to motivate the second main body of the second latching arm to be positioned above the first main body of the first latching arm.

18. The clip in accordance with claim 17, wherein the connecting portion is pivotally connected to the first and second latching arms about the free ends thereof, respectively.

19. The clip in accordance with claim 15, wherein a pressing surface is formed on the connecting portion, said pressing surface being located below both, said first main body and said second main body for abutment against the heat sink and thus for combining the clip, the heat sink and the socket together.

20. The clip in accordance with claim 15, wherein an operating portion is formed on the connecting portion.

* * * * *